(12) United States Patent
Ono

(10) Patent No.: US 8,829,500 B2
(45) Date of Patent: Sep. 9, 2014

(54) LIGHT EMITTING DEVICE

(75) Inventor: Yoshinobu Ono, Tsukubamirai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 348 days.

(21) Appl. No.: 13/498,552

(22) PCT Filed: Sep. 27, 2010

(86) PCT No.: PCT/JP2010/066649
§ 371 (c)(1),
(2), (4) Date: Aug. 6, 2012

(87) PCT Pub. No.: WO2011/040351
PCT Pub. Date: Apr. 7, 2011

(65) Prior Publication Data
US 2013/0048957 A1 Feb. 28, 2013

(30) Foreign Application Priority Data
Sep. 30, 2009 (JP) ................. 2009-226689

(51) Int. Cl.
*H01L 35/24* (2006.01)
(52) U.S. Cl.
USPC .................................. 257/40; 257/E51.001
(58) Field of Classification Search
USPC .......................................... 257/40, E51.001
See application file for complete search history.

(56) References Cited

U.S. PATENT DOCUMENTS

| 2004/0032220 A1 | 2/2004 | Cok et al. |
| 2011/0018416 A1 | 1/2011 | Sassa |

FOREIGN PATENT DOCUMENTS

| CN | 1869291 A | 11/2006 |
| CN | 1976054 A | 6/2007 |
| CN | 101009362 A | 8/2007 |
| JP | 2004-134385 A | 4/2004 |
| JP | 2004-186045 A | 7/2004 |
| JP | 2004-196923 A | 7/2004 |
| JP | 2005-310803 A | 4/2005 |
| JP | 2006-171336 A | 6/2006 |
| JP | 2006-244847 A | 9/2006 |
| JP | 2009-84510 A | 4/2009 |
| JP | 2009-218117 A | 9/2009 |
| JP | 2009-245770 A | 10/2009 |

OTHER PUBLICATIONS

Notice of Reasons for Rejection dated Sep. 3, 2013 in counterpart Japanese Patent Application No. P2009-226689 with English translation.
First Office Action issued Jan. 16, 2014 in counterpart Chinese Patent Application No. 201080043597.8 with English translation.

*Primary Examiner* — Anthony Ho
(74) *Attorney, Agent, or Firm* — Sughrue Mion, PLLC

(57) ABSTRACT

Provided is a light emitting device having a mechanism capable of efficiently dissipating heat kept in the device to the outside. The light emitting device includes: a first substrate including a heat radiation layer; a second substrate exhibiting light transmittance; and a plurality of organic EL elements provided, between the first substrate and the second substrate to emit light toward the second substrate. The second substrate includes fibrous, thermally conductive wires dispersively arranged therein, and the thermally conductive wires have a diameter of 0.4 μm or less and have a thermal conductivity higher than the remaining component of the second substrate excluding the thermally conductive wires.

7 Claims, 17 Drawing Sheets

Fig.17
(A)
(B)
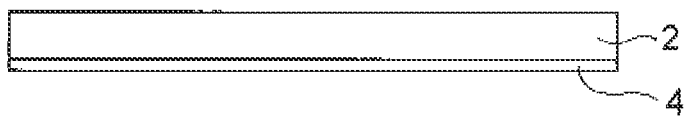
(C)
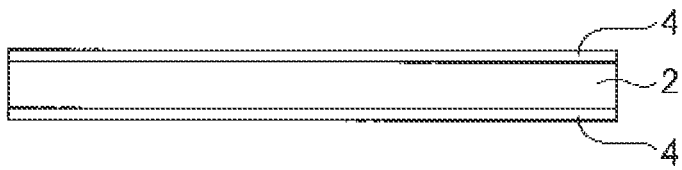
(D)
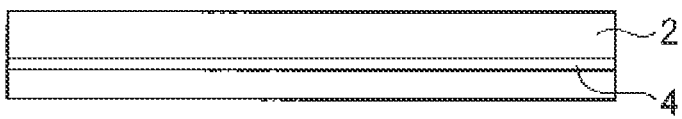

LIGHT EMITTING DEVICE

TECHNICAL FIELD

The present invention relates to a light emitting device.

BACKGROUND ART

A light emitting device having an organic electroluminescence element ("electroluminescence" will also be abbreviated as "EL" below) as a light source has been put into practice. Research and development is now being conducted for the purpose of improving light-emission, longevity, and other characteristics.

An organic EL element consumes part of electric power applied when a light emitting device is used, and the element thus generates heat per se. The element lifetime of the organic EL element is reduced when being kept driven at high temperatures. The organic EL element generates a greater amount of heat as its size increases. Therefore, the reduction of the element lifetime due to heat generation during driving is more significant as the element increases in size. For example, when compared with an organic EL element mounted as a light source for a pixel of a display device, an organic EL element mounted on a light emitting device such as a light source for a scanner or an illumination apparatus is far greater in one element size. Therefore, the amount of heat generation by one organic EL element is significantly increased, and the reduction of the element lifetime is noticeable. Then, it is contemplated to prevent a temperature increase of an organic EL element during use and the resultant reduction of element lifetime by providing a heat dissipation mechanism in the device to actively dissipate heat to the outside.

A device including an organic EL element is generally provided with a sealing member for sealing the element. A device configuration is proposed which prevents a temperature increase of an organic EL element by enhancing the heat dissipation performance of the sealing member (for example, see Patent Literature 1). In this conventional technique, in order to enhance the heat dissipation performance of the sealing member, the sealing member has a multilayer structure, which includes a layer having high thermal conductivity (hereinafter also referred to as a heat transfer layer).

CITATION LIST

Patent Literature

[Patent Literature 1] Japanese Patent Laid-Open Application No. 2005-310803

SUMMARY OF INVENTION

Technical Problem

The heat dissipation effect by the conventional heat transfer layer is not enough for heat generated by an organic EL element when a light emitting device is used, so that it is impossible to sufficiently prevent a temperature increase inside the device and the resultant reduction of element lifetime.

The conventional heat transfer layer is made of a material having high thermal conductivity, such as gold, silver, or copper, which is usually opaque. Therefore, in order to apply the conventional heat transfer layer to a device configured such that light radiated from the organic EL element is emitted through the sealing member, it is necessary to make the thickness of the heat transfer layer extremely thin (layer thickness of 10 nm or less) and to make the heat transfer layer translucent. However, when the heat transfer layer is extremely thin, the heat transfer effect is reduced accordingly. Therefore, the heat transfer layer does not function well.

An object of the present invention is therefore to provide a light emitting device having a mechanism capable of efficiently dissipating heat kept in the device to the outside.

Solution to Problem

The present invention relates to a light emitting device including a first substrate including a heat radiation layer, a second substrate exhibiting light transmittance, and a plurality of organic EL elements provided between the first substrate and the second substrate to emit light toward the second substrate. The second substrate includes fibrous, thermally conductive wires dispersively arranged therein. The thermally conductive wires have a diameter of 0.4 μm or less and have a thermal conductivity higher than the remaining component of the second substrate excluding the thermally conductive wires.

The present invention further relates to the light emitting device wherein the first substrate includes a heat dissipation member having heat radiation performance.

The present invention further relates to the light emitting device wherein the heat radiation layer is arranged approximately vertically to a thickness direction of the first substrate. The plurality of organic EL elements each are arranged at a position overlaid on the heat radiation layer as viewed from one thickness direction of the first substrate.

The present invention further relates to the light emitting device wherein a gap is provided between the first or second substrate and the plurality of organic EL elements. The gap is filled with a thermally conductive member including resin exhibiting light transmittance and the fibrous, thermally conductive wires dispersively arranged in the resin.

The present invention further relates to the light emitting device wherein each of the thermally conductive wires is at least one of a metal nanowire and a carbon nanotube.

The present invention further relates to the light emitting device wherein the plurality of organic EL elements form a series connection and/or a parallel connection.

Advantageous Effects of Invention

According to the present invention, a plurality of organic EL elements are provided between the first substrate and the second substrate and emit light toward the second substrate.

The thermally conductive wires are dispersively arranged in the second substrate. Each of the thermally conductive wires has a diameter of 0.4 μm or less and thus allows visible light to pass through. The second substrate achieving both high light transmittance and high heat conduction can be implemented by dispersively arranging such thermally conductive wires. The first substrate with high heat radiation can be implemented by providing a heat radiation layer on the first substrate.

The organic EL elements are provided between the first substrate with high heat radiation and the second substrate with high heat conduction in this manner, whereby heat generated from the organic EL elements can be efficiently dissipated to the outside. Accordingly, it is possible to prevent a temperature increase of the organic EL elements and the resultant reduction of element lifetime.

BRIEF DESCRIPTION OF DRAWINGS

FIG. 17 is a longitudinal sectional view of a first substrate.

DESCRIPTION OF EMBODIMENTS

Figure 1:
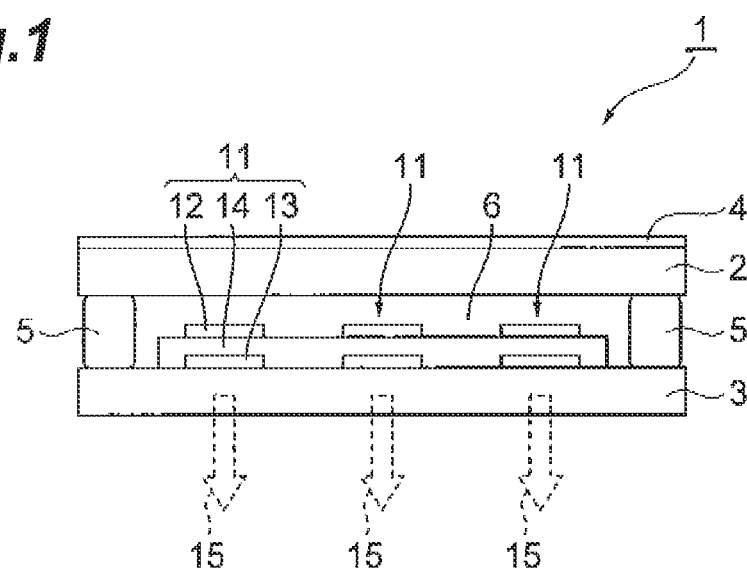
FIG. 1 is a cross-sectional view schematically illustrating a light emitting device 1.
Figure 14:
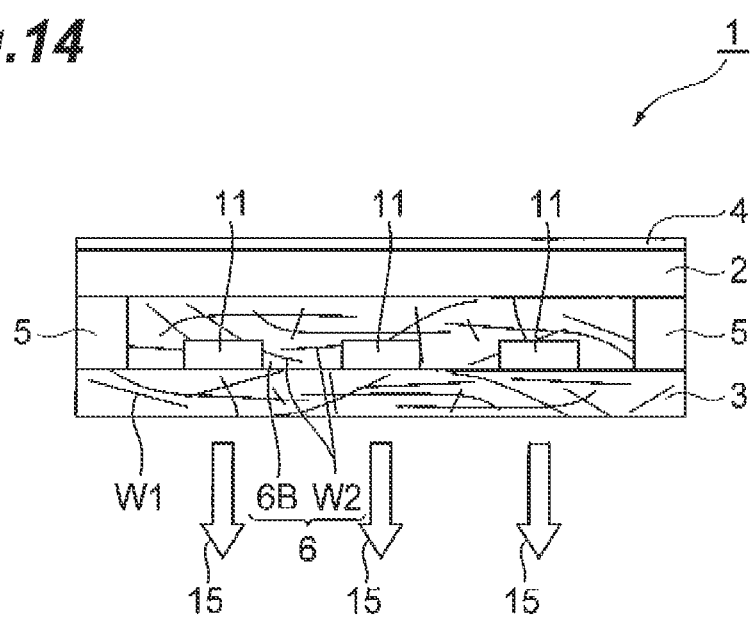
FIG. 14 is a cross-sectional view of a light emitting device.

An embodiment of the present invention will be described below with reference to the figures. FIG. 1 is a cross-sectional view schematically illustrating a light emitting device 1 in the present embodiment. FIG. 14 schematically illustrates the presence of thermally conductive wires in the light emitting device illustrated in FIG. 1.

The light emitting device 1 includes a first substrate 2 having a heat radiation layer 4, a second substrate 3 having light transmittance, and a plurality of organic EL elements 11 provided between the first substrate 2 and the second substrate 3 to emit light toward the second substrate 3. The second substrate 3 includes fibrous, thermally conductive wires dispersively arranged therein. The thermally conductive wire has a diameter of 0.4 µm or less and a thermal conductivity higher than the remaining component of the second substrate excluding the thermally conductive wire.

(Configuration of Light Emitting Device)

The light emitting device 1 includes two substrates. One of the two substrates is referred to as the first substrate 2, and the other is referred to as the second substrate 3. The first substrate 2 and the second substrate 3 are arranged to be opposed at a prescribed distance from each other. The plurality of organic EL elements 11 are provided between the first substrate 2 and the second substrate 3.

One of the first and second substrates 2 and 3 is provided as a sealing substrate for sealing the organic EL elements 11, and the other of the first and second substrates 2 and 3 is provided as a support substrate on which the organic EL elements are mounted. Prescribed wiring for supplying electric power to the organic EL elements is generally formed in the support substrate.

Figure 3:
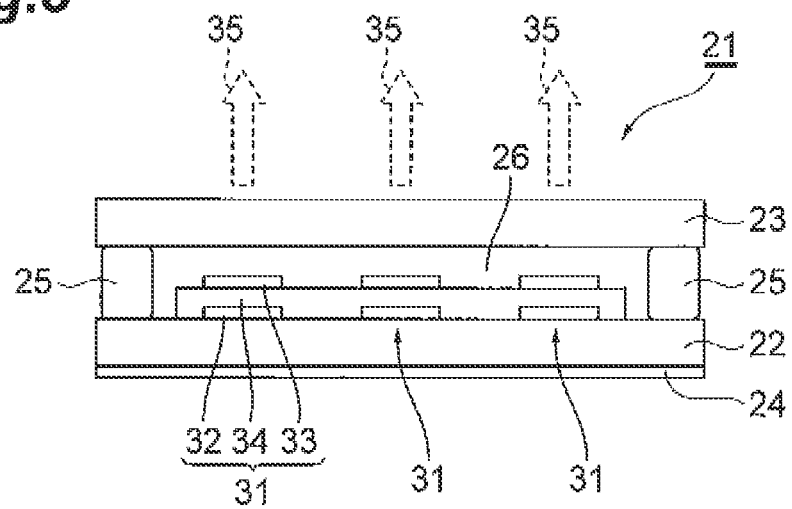
FIG. 3 is a cross-sectional view schematically illustrating a light emitting device 21.

Organic EL elements are roughly classified into a bottom emission-type element that emits light toward the support substrate and a top emission-type element that emits light toward the sealing substrate. In the following, first, the light emitting device 1 having the bottom emission-type organic EL elements 11 mounted thereon as illustrated in FIG. 1 will be described, and next, a light emitting device 21 having the top emission-type organic EL elements 31 mounted thereon as illustrated in FIG. 3 will be described.

The light emitting device 1 illustrated in FIG. 1 has the bottom emission-type organic EL elements. Therefore, the first substrate 2 corresponds to the sealing substrate, and the second substrate 3 exhibiting light transmittance corresponds to the support substrate. Specifically, in the present embodiment, organic EL elements are formed on the second substrate 3, and the first substrate 2 is provided thereon as the sealing substrate.

The organic EL elements 11 emit light toward the second substrate 3. Light radiated from the organic EL elements 11 is emitted to the outside through the second substrate 3. The second substrate 3 is thus formed of a member exhibiting light transmittance. In FIG. 1, the direction of light radiated from the organic EL elements 11 is shown by arrows 15.

Figure 12:
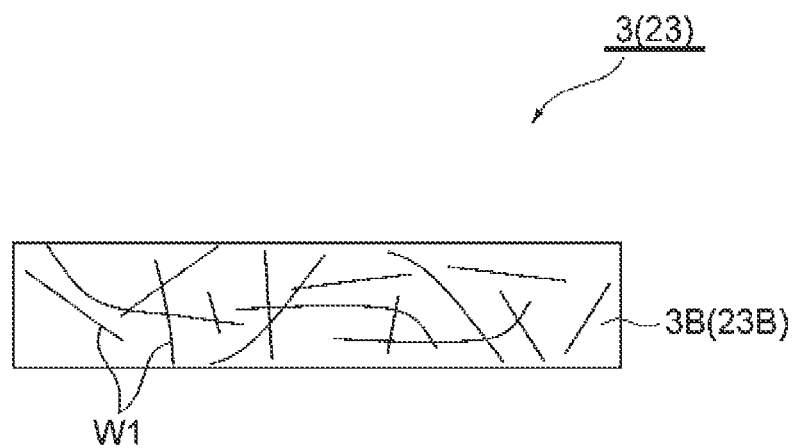
FIG. 12 is a longitudinal sectional view of a second substrate.
Figure 13:
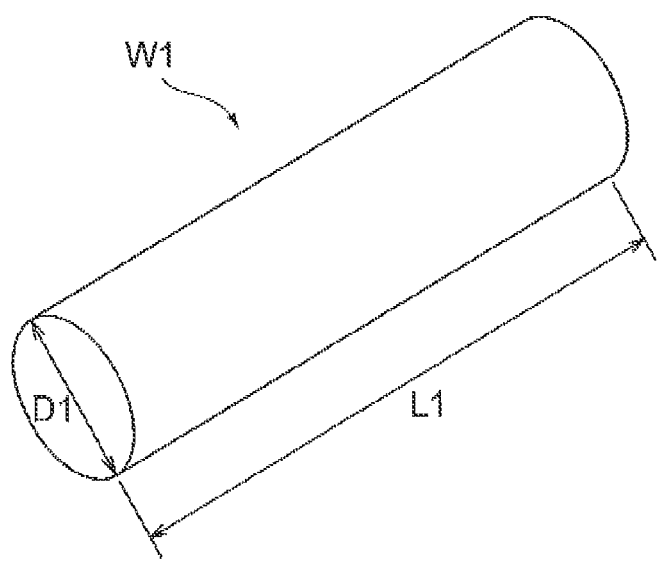
FIG. 13 is a perspective view of a thermally conductive wire.

FIG. 12 is a longitudinal sectional view of the second substrate, and FIG. 13 is a perspective view of a thermally conductive wire. As illustrated in FIG. 12, the second substrate 3 includes fibrous, thermally conductive wires W1 dispersively arranged therein. The thermally conductive wires W1 have a diameter of 0.4 µm or less and have a thermal conductivity higher than the remaining component (base material 3B) of the second substrate 3, excluding the thermally conductive wires W1. An infinite number of thermally conductive wires are dispersively arranged in the second substrate 3. In the present specification, the diameter D1 (see FIG. 13) of the thermally conductive wire means the mean value of diameters of all the thermally conductive wires arranged in the second substrate 3. The diameter of the thermally conductive wire can be calculated based on the diameters of a prescribed number of wires which are measured using, for example, an electron microscope. The thermal conductivity of the sealing member such as the first substrate and the second substrate can be measured according to the steady state heat flow meter method (ASTM E 1530).

The maximum value (0.4 µm) of diameter of the thermally conductive wire provided in the second substrate 3 is in the order of the minimum value of wavelengths of visible light. Because of the use of such a wire having a small diameter, light entering the second substrate 3 can pass through the second substrate 3 without being inhibited by the thermally conductive wires. Therefore, even when the thermally conductive wires are dispersively arranged in the second substrate 3, the high light transmittance of the second substrate 3 can be kept.

The thermally conductive wire has a thermal conductivity higher than the remaining component of the second substrate 3 excluding the thermally conductive wires. In other words, the thermal conductivity of the thermally conductive wire is higher than the thermal conductivity of the second substrate without the thermally conductive wires, where the second substrate is constituted with the material excluding the thermally conductive wires. The thermally conductive wires having high thermal conductivity in this manner are dispersively arranged in the second substrate 3, whereby the second substrate having a thermal conductivity higher than that of a substrate without the thermally conductive wires is implemented. The second substrate 3 achieving both high light transmittance and high heat conduction is thus implemented.

The thermal conductivity of resin or glass generally used as the support substrate (the second substrate in this embodiment) is generally low. Therefore, when the support substrate is formed using resin or glass, heat generated inside the light emitting device 1 is hardly conducted to the support substrate. Therefore, when the light emitting device is configured using the conventional support substrate, heat remains in the light emitting device, an a temperature increase of the light emitting device is not effectively prevented.

By contrast, in the second substrate in the present embodiment, the thermally conductive wires that do not inhibit transmission of light and have high thermal conductivity are dispersively arranged, whereby a substrate that efficiently conducts heat can be achieved with high light transmittance being kept. When the light emitting device 1 is configured with such a second substrate, heat generated inside the light emitting device 1 is conducted to the second substrate and further diffuses in the second substrate, whereby heat is efficiently dissipated to the outside. Accordingly, a temperature increase of the light emitting device 1 can be prevented effectively.

Preferably, each of the thermally conductive wires is at least one of a metal nanowire and a carbon nanotube.

Figure 16:
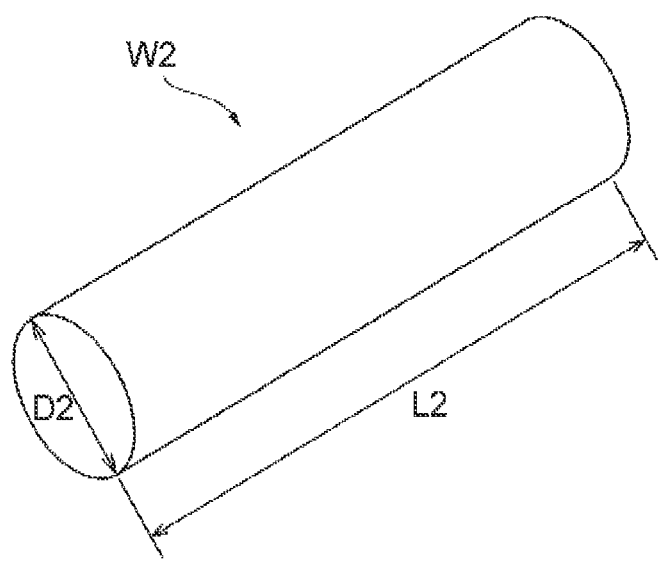
FIG. 16 is a perspective view of a thermally conductive wire.

For example, as illustrated in FIG. 12, the second substrate 3 is configured with a base material 3B made of glass, resin or the like and a plurality of thermally conductive wires W1 dispersively arranged in the base material 3B. Preferably, thermally conductive wires W2 are also contained in a thermally conductive member as described later. FIG. 13 illustrates an example of the single thermally conductive wire W1 and FIG. 16 illustrates an example of the single thermally conductive wire W2. A second substrate 23 as described later is configured with a base material 23B made of glass, resin or the like and a plurality of thermally conductive wires W1 dispersively arranged in the base material 23B, as illustrated in FIG. 12. In any case, a transparent material having a transmittance for emission light from the organic EL layer can be used for the base materials 3B and 23B.

The thermally conductive wires W1 and W2 are fibrous. A needle-like or curve-shaped thermally conductive wire and a hollow-tube thermally conductive wire can be used as the fibrous, thermally conductive wires W1 and W2.

Preferably, the thermally conductive wires W1 and W2 form a mesh structure in the base material such as glass and resin. This is because when the thermally conductive wires W1 and W2 form a mesh structure, the thermally conductive wires are in contact with each other and successively conduct heat to the adjacent thermally conductive wires, thereby implementing the second substrate having high thermal conductivity. A random orientation of the thermally conductive wires achieves the effect of improving heat conduction. However, the orientation of the thermally conductive wires in the thickness direction of the second substrate is preferred because heat conduction in the thickness direction of the second substrate is better and the effect of improving heat conduction in the thickness direction of the second substrate is further improved.

The diameters D1 and D2 of the thermally conductive wires W1 and W2, respectively, are 0.4 μm or less, preferably 0.35 μm or less, and more preferably 0.3 μm or less. The diameters D1 and D2 of the thermally conductive wires that are too small will fail to achieve the heat diffusion effect, and therefore, the diameters D1 and D2 are usually 0.001 μm or more. The mean value of the outer diameters of a single thermally conductive wire is assumed as the diameter D1 or D2. More specifically, when the mean values of physical quantities (size: diameter, length) of the diameter D1 of a single thermally conductive wire and the diameter D2 of another single thermally conductive wire are within a suitable range described in the present application, the mean value of physical quantities (size: diameter, length) of a plurality of thermally conductive wires falls within the suitable range as defined in the subject application. When the maximum value of these physical quantities is equal to or smaller than the upper limit of the suitable range of each physical quantity, the effect brought about in the case of the upper limit or lower can be achieved, and when the minimum value of these physical quantities is equal to or greater than the lower limit of the suitable range of each physical quantity, the effect brought about in the case of the lower limit or greater can be achieved, as a matter of course.

The lengths L1 and L2 of the thermally conductive wires W1 and W2, respectively, are preferably 0.5 μm or more, and more preferably 1 μm or more. The aspect ratio (length/diameter) of the thermally conductive wires W1 and W2 is preferably 10 or more, more preferably 30 or more. A higher aspect ratio is preferred because the thermally conductive wires mutually connect to form a network thereby improving the effect of improving heat conduction. Conversely, when the aspect ratio is too small, sufficient heat conduction may not be obtained.

The thermal conductivity of a single wall carbon nanotube (SWCNT) is extremely high and is estimated as 1750 to 5800 W/m·K. Some SWCNTs in a massive form have a thermal conductivity 200 W/m·K or more as the measurement value at room temperature in the alignment direction. Such data is described, for example, in Applied Physics Letters, Volume 77, No. 5, pp. 666-668, 2000.

A higher mixture ratio of the thermally conductive wires W1 in the second substrate 3 will achieve higher heat conduction. An increase in the mixture ratio, however, reduces the light transmittance. For this reason, the mixture ratio of the thermally conductive wires W1 is set as appropriate in consideration of the trade-off between heat conduction and light transmittance. The proportion of the thermally conductive wires W1 included in the second substrate is preferably 0.1% or more and 50% or less by weight fraction. If the weight fraction is too low, the intended heat conduction may not be obtained. Meanwhile, if the weight fraction is too high, the light transmittance may be reduced.

A plurality of organic EL elements 11 are provided on the second substrate 3. The organic EL element 11 is configured to include a pair of electrodes 12 and 13 and a prescribed layer (organic EL layer) 14 including one or more layers provided between the electrodes. At least one light-emitting layer is included as the prescribed layer 14.

The organic EL element 11 is preferably large in size when only the brightness is considered, because the quantity of light increases with increase in size as two-dimensionally viewed. However, when the organic EL element increases in size, it is difficult to obtain uniform light emission over the entire surface of the element. This is because as the organic EL element increases in size, it is more difficult to form the prescribed layer 14 and the electrodes 12 and 13 of the organic EL element with a uniform film thickness, and a voltage drop at the electrodes increases. Considering the easiness of film formation with a uniform thickness and the light emission characteristics, there is a limit to increasing the size of the organic EL element as two-dimensionally viewed. Thus, there is also a limit to the amount of light emission by one organic EL element. Therefore, it is difficult to satisfy the quantity of light required for the light emitting device only with one organic EL element. Then, in order to ensure a prescribed brightness required for the light emitting device, a plurality of organic EL elements 11 are provided on the second substrate 3.

The organic EL element mounted on a light emitting device such as a light source of a scanner or an illumination apparatus is far larger in size as two-dimensionally viewed when compared with the organic EL element mounted as a light source for a pixel of a display device. For example, the width of the organic EL element mounted on a display device as two-dimensionally viewed is in the order of micrometers, whereas the width of the organic EL element mounted on a light emitting device as two-dimensionally viewed is in the order of centimeters. For example, the length and width of the organic EL element mounted on a light emitting device each are about 1 cm. Therefore, the amount of heat generated from each organic EL element mounted on a light emitting device is by far greater than that of the organic EL element mounted on a display device. Then, to prevent a temperature increase due to heat generation is more important in a light emitting device.

Figure 2:
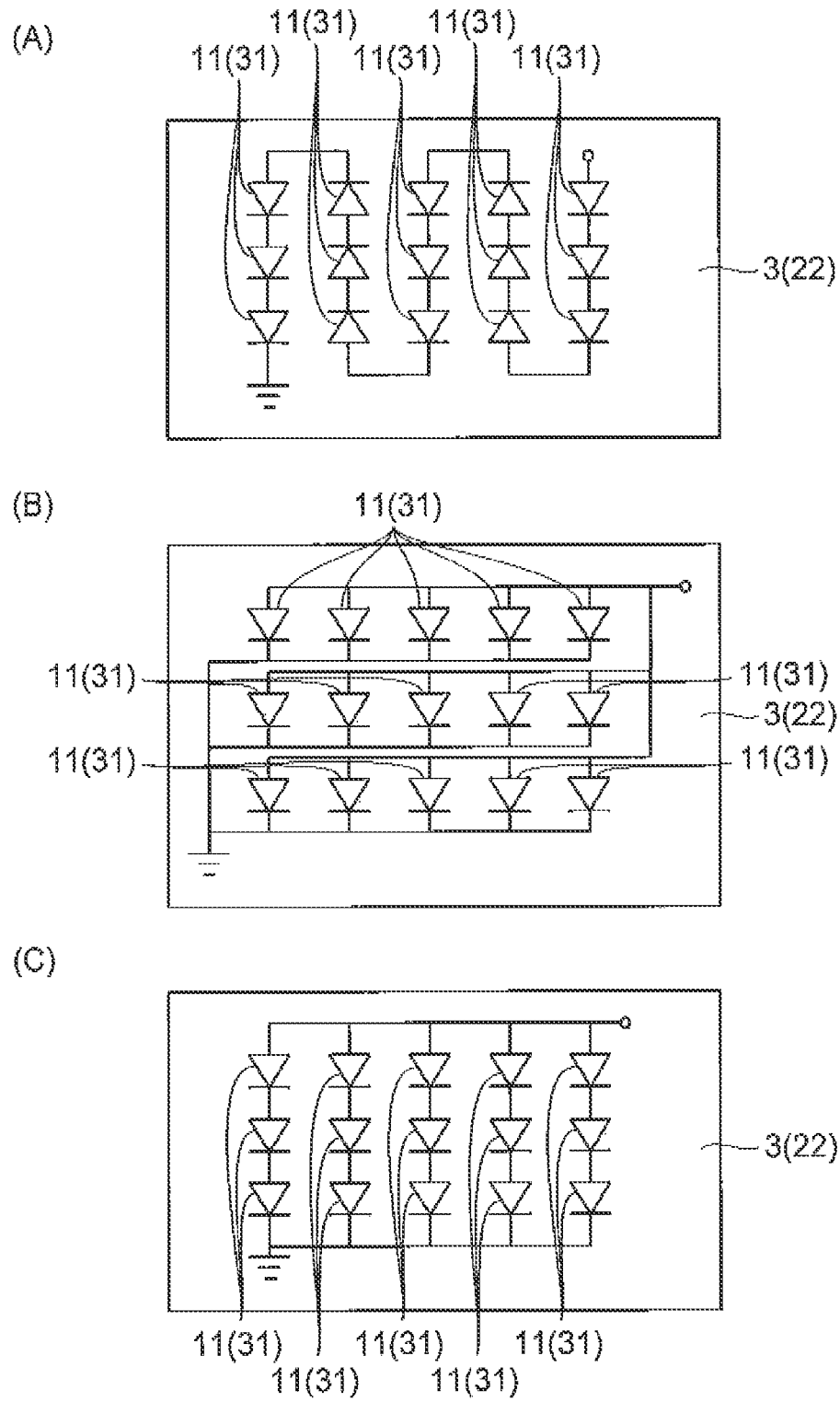
FIG. 2 is a diagram schematically illustrating a connection between a plurality of organic EL elements.

A plurality of organic EL elements 11 or organic EL elements 31 described later are connected in series and/or connected in parallel. FIG. 2 schematically illustrates connection of a plurality of organic EL elements and arrangement of organic EL elements on the support substrate.

In FIG. 2, individual organic EL elements each are shown by a circuit symbol generally representing a diode, and the polarity of individual elements and connection therebetween are also shown.

FIG. 2(A) schematically illustrates a states in which all the organic EL elements 11 (31) formed on the support substrate 3 (22) are connected in series. FIG. 2(B) schematically illustrates a state in which all the organic EL elements 11 (31) formed on the support substrate 3 (22) are connected in parallel. FIG. 2(C) schematically illustrates a state in which a plurality of organic EL elements 11 formed on the support substrate 3 (22) are connected in series to form an organic EL element group (in the figure, a group made of three organic EL elements) and the organic EL element groups are connected in parallel with each other. The state in which a plurality of organic EL elements 11 are connected in series and connected in parallel means that a plurality of series connections, each formed by connecting a plurality of organic EL elements in series, are connected in parallel. In FIG. 2(C), five series connection groups, each formed by connecting three organic EL elements in series, are connected in parallel.

In a case where there are a large number of organic EL elements 11 (31), it is more preferable to connect a plurality of organic. EL elements 11 (31) in series and connect them in parallel as illustrated in FIG. 2(C), rather than connecting all of them in series or in parallel. The reason is as follows. In the case where all the organic EL elements are connected in series, a drive voltage to be supplied to the light emitting device 1 becomes too high. By contrast, in the case where all the organic EL elements are connected in parallel, if a short circuit occurs between electrodes of even one organic EL element, current intensively flows in the organic EL element having the short circuit to turn off any other normal organic EL element, and, consequently, all the organic EL elements 11 (31) may turn off. On the other hand, in the case where a plurality of organic EL elements 11 (31) are connected in series and connected in parallel as illustrated in FIG. 2 (C), the series connection formed of a proper number of organic EL elements 11 (31) prevents a rise of the drive voltage to be supplied, and even when a short circuit occurs between the electrodes of one organic EL element 11(31), only the organic EL element 11(31) having the short circuit turns off, and turning off of other normal organic EL elements 11 (31) can be prevented.

Generally, wiring for supplying electric power to each organic EL element is formed on the support substrate. The organic EL elements are electrically connected, for example, through this wiring. For example, when adjacent organic EL elements are connected in series, one electrode 13 (33) of a pair of electrodes of one organic EL element and the other electrode 12 (32) of a pair of electrodes of the other organic EL element can be connected with each other by drawing them to a region in which the prescribed layer 14 (34) is not provided, and physically connecting them in this region.

As illustrated in FIG. 1, the first substrate 2 is provided on a plurality of organic EL elements 11. The first substrate 2 is affixed to the second substrate 3, for example, by a prescribed adhesive member 5. The adhesive member 5 is arranged, for example, at a position to surround a plurality of organic EL elements 11 in a state in which the first substrate 2 and the second substrate 3 are affixed to be opposed to each other.

The first substrate 2 has the heat radiation layer 4 having heat radiation performance. One heat radiation layer or a plurality of heat radiation layers may be provided on the first substrate 2. As illustrated in FIG. 1 or FIG. 17(A), FIG. 17(B), the heat radiation layer 4 is provided, for example, on one surface or the other surface of the first substrate 2 in the thickness direction. The heat radiation layer 4 may be provided on one surface and the other surface of the first substrate 2 in the thickness direction as illustrated in FIG. 17(C), or may be provided in the middle portion of the first substrate 2 in the thickness direction as illustrated in FIG. 17(D). Preferably, the heat radiation layer 4 is provided on at least a surface opposite to the side having the organic EL elements 11, of both main surfaces of the first substrate 2, in order to efficiently radiate the heat conducted to the first substrate 2 to the outside. In FIG. 17, it is assumed that the organic EL elements 11 are positioned on the lower side in the drawing sheet.

It is preferable that the heat radiation layer 4 is arranged approximately vertically to the thickness direction of the first substrate 2 and that the organic EL element 11 is arranged at a position overlaid on the heat radiation layer 4 as viewed from one side in the thickness direction of the first substrate 2. When the heat radiation layer is provided in such an arrangement, each organic EL element as a heat source and the heat radiation layer radiating heat can be arranged such that the distance therebetween is the shortest, whereby the heat generated from the organic EL element can be efficiently dissipated.

The heat radiation layer 4 has heat radiation performance. Heat radiation means a phenomenon in which thermal energy is radiated as electromagnetic waves from an object. The thermal emissivity of the heat radiation layer 4 is preferably 0.70 or more, more preferably 0.85 or more. The thermal emissivity of the heat radiation layer 4 is a value obtained by dividing the amount of energy radiated from the surface of the heat radiation layer 4 at a prescribed temperature by the amount of energy radiated from a black body at the same temperature as the heat radiation layer 4. The thermal emissivity can be measured using Fourier transform infrared spectroscopy (FT-IR). The prescribed temperature is, for example, −50° C. to 100° C.

Because of the provision of the heat radiation layer 4 in this manner, the heat conducted to the first substrate 2 and diffusing in the first substrate 2 can be actively dissipated to the outside. Accordingly, a temperature increase of the organic EL elements 11 can be prevented.

Preferably, the heat radiation layer 4 has high heat conduction performance in addition to heat radiation performance. The thermal conductivity of the heat radiation layer 4 is preferably 1 W/(m·k) or more, more preferably 10 W/(m·k), and further preferably 200 W/(m·k). The thermal conductivity can be measured, for example, by a method described in ASTM D5470 (American Society For Testing and Materials D5470).

The heat conducted to the first substrate 2 can be diffused inside the heat radiation layer 4 since the heat radiation layer 4 has high heat conduction performance in addition to high heat radiation performance. Therefore, more uniform temperature distribution in the light emitting device 1 can be promoted. The heat conducted to the first substrate 2 is diffused in the heat radiation layer 4 and radiated to the outside in this manner, whereby the heat generated inside the light emitting device 1 can be efficiently dissipated.

The heat radiation layer 4 may be formed of one layer or may be formed of a stack of two or more layers. For example, the heat radiation layer 4 formed of only one layer can be configured by mixing a material having high thermal conductivity and a material with high heat radiation into a base material such as resin. The heat radiation layer 4 formed of a stack of two or more layers can be configured by stacking one or more layers exhibiting high heat conduction and one or more layers exhibiting high heat radiation.

Examples of the material with high heat radiation include a black material. A pigment component of a black paint may be suitably used. Examples of the material of the heat radiation layer 4 include a mixed material (carbon plastic) of a carbon material and a plastic material, $TiO_2$ doped with a prescribed metal element, a colloid in which titania and a prescribed metal fine particle are dispersed, $Fe_3O_4$, and the like. Examples of the material with high heat conduction include aluminum, copper, silver, ceramic materials, resins with high heat conduction, and the like. Examples of the resins with high heat conduction include epoxy resins, melamine resins, acrylic resins, and the like.

When the heat conduction of the material that mainly forms the first substrate is low, preferably, the thermally conductive wires are dispersively arranged in the first substrate 2. The first substrate with good heat conduction can be implemented by dispersively arranging the thermally conductive wires in this manner. The structure of the first substrate in this case can be the same as the structure of the second substrate, and the structure illustrated in FIG. 12 can be employed for the first substrate. Thus, the heat generated by driving the organic EL elements 11 can be efficiently conducted to the heat radiation layer 4 whereby a temperature increase of the organic EL elements 11 can be prevented. As the first substrate may be opaque, the thermally conductive wires dispersively arranged in the first substrate may be those that inhibit transmission of light, and a prescribed material can be used as appropriate, irrespective of the optical property.

A gap is generally formed between the first substrate and a plurality of organic EL elements or between the second substrate and a plurality of organic EL elements. This gap is generally formed between the substrate provided as a sealing substrate and a plurality of organic EL elements. In the present embodiment, a gap is formed between the first substrate provided as a sealing substrate and a plurality of organic EL elements.

Preferably, this gap is filled with a thermally conductive member 6. In the case of a light emitting device (for example, see FIG. 3) configured such that light radiated from the organic EL elements 11 is emitted to the outside through the thermally conductive member 6, the thermally conductive member 6 has to be formed of a member exhibiting light transmittance. By contrast, as in the present embodiment illustrated in FIG. 1, in the case of the light emitting device 1 configured such that light radiated from the organic EL elements 11 is emitted to the outside without passing through the thermally conductive member 6, the thermally conductive member 6 does not have to be formed of a member exhibiting light transmittance but may be formed of a member not exhibiting light transmittance.

For example, the thermally conductive member 6 may be configured to include resin 6B and a plurality of thermally conductive wires W2 dispersively arranged in the resin 6B, as illustrated in FIG. 14. In the case where the thermally conductive member 6 exhibiting light transmittance is formed, the thermally conductive member 6 may be formed using the resin 6B exhibiting light transmittance and the thermally conductive wires W2 having a diameter of 0.4 μm or less.

Since the gap between the organic EL elements and the first substrate is filled with the thermally conductive member 6, heat generated by driving the organic EL elements 11 can be efficiently conducted to the first substrate 2, thereby preventing a temperature increase of the organic EL elements 11. It is noted that the thermally conductive member 6 is in contact with the first substrate 2, the second substrate 3, and the organic EL elements 11.

As described above, because of the use of the second substrate 3 exhibiting high heat conduction, heat can be dissipated to the outside from the second substrate 3 side. In addition, because of the use of the first substrate 2 having a heat radiation layer, heat can also be dissipated to the outside from the first substrate 2 side. The light emitting device 1 is configured such that a plurality of organic EL elements are sandwiched by a substrate exhibiting heat radiation or heat conduction in this manner, whereby heat generated from the organic EL elements can be efficiently dissipated to the outside. Accordingly, a temperature increase of the organic EL elements and the resultant reduction of element lifetime can be prevented.

A light emitting device having a bottom emission-type organic EL element which emits light toward the second substrate corresponding to the support substrate has been described above. The present invention is also applicable to a light emitting device having a top emission-type organic EL element which emits light toward the sealing substrate, as described above.

Figure 15:
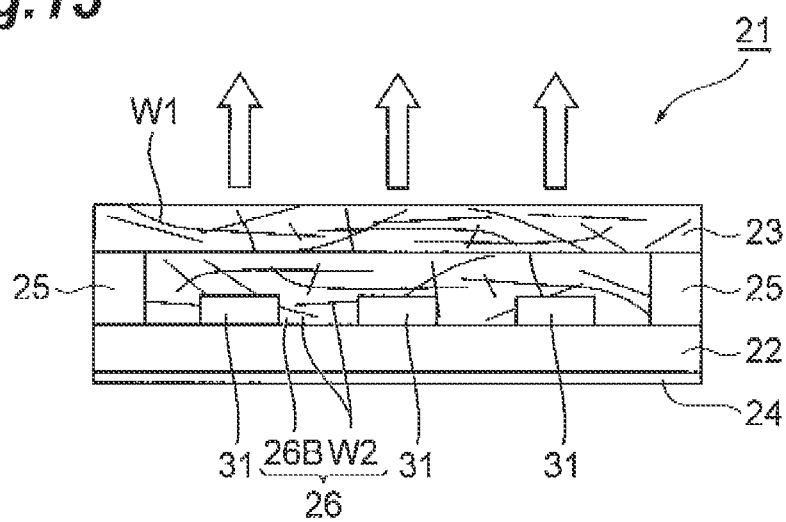
FIG. 15 is a cross-sectional view of a light emitting device.

FIG. 3 is a cross-sectional view schematically illustrating a light emitting device 21 in another embodiment of the present invention. FIG. 15 schematically illustrates the presence of thermally conductive wires in the light emitting device illustrated in FIG. 3. In the light emitting device in the foregoing embodiment illustrated in FIG. 1, the sealing substrate is described as the first substrate 2, and the support substrate is described as the second substrate 3. By contrast, in the light emitting device 21 in the present embodiment illustrated in FIG. 3, the numerals denoting the substrates are changed. Specifically, the support substrate is described as a first substrate 22, and the sealing substrate is described as a second substrate 23. In the embodiment illustrated in FIG. 1, a substrate exhibiting light transmittance is used as the support substrate (second substrate), whereas in the present embodiment illustrated in FIG. 3, a substrate exhibiting light transmittance is used as the sealing substrate (second substrate). In short, in the embodiments illustrated in FIG. 1 and FIG. 3, a substrate exhibiting light transmittance is used as the second substrate. A plurality of organic EL elements 31 emit light toward the second substrate, and therefore, in the present embodiment, light radiated from the organic EL elements 31 is emitted to the outside through the second substrate provided as the sealing substrate. In FIG. 3, the direction of light radiated from the organic EL elements 31 is shown by arrows 35.

The first substrate 22 is provided as the support substrate. The first substrate 22 has a heat radiation layer 24. Members of the same or equivalent materials as the first substrate 2 and the heat radiation layer 4 that constitutes part of the first substrate 2 in the foregoing embodiment illustrated in FIG. 1 can be used for the first substrate 22 and the heat radiation layer 24 that constitutes part of the first substrate 22.

The first substrate 22 may be formed of an opaque member similarly to the first substrate 2 in the foregoing embodiment. In order to improve heat conduction, preferably, the thermally conductive wires are dispersively arranged in the first substrate 22, in a similar manner as the foregoing embodiment. In this case, the structure of the first substrate is the one illustrated in FIG. 12.

A plurality of organic El elements 31 are provided on the first substrate 22. The plurality of organic EL elements 31 are connected in series and/or connected in parallel as described above in FIG. 2.

The second substrate 23 is provided as the sealing substrate. The second substrate 23 is affixed to the first substrate 22 with a plurality of organic EL elements 31 interposed therebetween. The second substrate 23 is formed of a member exhibiting light transmittance in a similar manner as the second substrate 3 in the embodiment illustrated in FIG. 1, and the thermally conductive wires W1 having a diameter D1 of 0.4 μm or less are dispersively arranged therein as illustrated in FIG. 12 and FIG. 13 in a similar manner as the second substrate 3 in the embodiment illustrated in FIG. 1. The suitable range of the size of the wire W1 can be the same or equivalent range as in the case of the embodiment illustrated in FIG. 1.

In the present embodiment, a gap is provided between the second substrate 23 and a plurality of organic EL elements 31. Preferably, the gap is filled with a thermally conductive member in a similar manner as the foregoing embodiment. The thermally conductive member in the foregoing embodiment may be the one that exhibits no light transmittance. However, in the present embodiment, the thermally conductive member 26 has to be formed of a member exhibiting light transmittance since light radiated from the organic EL elements is emitted to the outside through the thermally conductive member 26 and the second substrate 23.

As described in the foregoing embodiment, in order to form a thermally conductive member exhibiting light transmittance in the gap, the thermally conductive member 26 may be formed, for example, using resin 26B exhibiting light transmittance and the thermally conductive wires W2 having a diameter of 0.4 μm or less which are dispersively arranged in the resin 26B. The suitable range of the size of the thermally conductive wire W2 is the same or equivalent range as in the case of the embodiment illustrated in FIG. 1.

With the configuration of the light emitting device 21 as described above, a temperature increase of the organic EL elements 31 during use and the resultant reduction of element lifetime can be prevented similarly to the light emitting device 1 in the foregoing embodiment.

In the light emitting device in the foregoing embodiments, the thermally conductive wires may be dispersively arranged in the thermally conductive member and the support substrate in order to improve heat conduction. When the thermally conductive wires dispersively arranged have electrical conductivity, the addition of the thermally conductive wires imparts electrical conductivity to the thermally conductive member and the support substrate. Depending on the amount of addition and physical property of the thermally conductive wires, the thermally conductive member and the support substrate may become conductive so that the adjacent organic EL elements may electrically conduct with each other. If the electrical resistance of the thermally conductive member and the support substrate becomes low to such a degree that affects the operation of the light emitting device, for example, an electrical insulation layer can be provided between a plurality of the support substrates and/or thermally conductive members and the organic EL elements 11. However, even if the thermally conductive wires are added, the electrical resistance of the thermally conductive member and the support substrate does not become so low as a conductor, and therefore, the thermally conductive member and the support substrate can be handled substantially as an insulator. Therefore, there is little possibility that the addition of the thermally conductive wires has a substantial effect on the operation of the light emitting device. Thus, in such a case, there is no special necessity to provide a member for electrically insulating a plurality of organic EL elements.

[Method of Producing Light Emitting Device]

First, a method of producing the light emitting device 1 illustrated in FIG. 1 will be described.

(Second Substrate)

The second substrate 3 provided as the support substrate is prepared. The second substrate 3 is a support substrate exhibiting light transmittance and has thermally conductive wires dispersively arranged therein.

Preferably, each of the thermally conductive wires is at least one of a metal nanowire or a carbon nanotube.

The metal nanowire is formed of for example, Ag, Au, Cu, Al, and alloys thereof. The thermally conductive wire made of metal can be produced by a general well-known method. Examples of the well-known production method include a method by N. R. Jana, L. Gearheart and C. J. Murphy (Chm. Commun., 2001, p 617-p 618) and a method by C. Ducamp-Sanguesa, R. Herrera-Urbina, and M. Figlarz, et al. (J. Solid State Chem., Vol. 100, 1992, p 272-p 280). For example, a silver nanowire (the longitudinal average length: 1 μm, the lateral average length: 10 nm) having a surface protected by an amino group-containing polymeric dispersant (manufactured by ICI Japan Ltd. under the product name "Solsperse 24000SC") can be used.

A single wall carbon nanotube, a double wall carbon nanotube, a multiwall carbon nanotube, a rope-like carbon nanotube, and the like may be used as the carbon nanotube. The carbon nanotube may be a pure carbon nanotube only formed of carbon atoms, or may be a carbon nanotube in which carbon atoms are partially replaced with heteroatoms such as B, N, and O. The carbon nanotube may be a carbon nanotube having a carbon atom at the distal end and/or the side modified with a functional group.

The second substrate is configured such that the thermally conductive wires are dispersively arranged in resin or glass exhibiting light transmittance. The second substrate is formed, for example, by applying a dispersion liquid containing a resin material and thermally conductive wires dispersed in a dispersion medium on a prescribed base to form a film, and solidifying the film. In a case where a light-curable resin or a thermosetting resin is used as the resin material, the second substrate can be hardened by removing the dispersion medium and performing a light radiation process or a heating process. Alternatively, the second substrate may be formed by applying a dispersion liquid containing thermally conductive wires dispersed in a dispersion medium on a prescribed base, then removing the dispersion liquid through a heating process or the like to form a layer only made of thermally conductive wires, and then impregnating the formed layer with resin.

Any dispersion medium may be used as long as it dissolves or disperses resin, and examples thereof include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methyl ethyl ketone, ester-based solvents such as ethyl acetate, butyl acetate, and ethyl cellosolve acetate, and amine compound-based solvents such as N-methylpyrrolidone (NMP).

A prescribed surfactant may be added to the dispersion medium. For example, as carbon nanotubes may coagulate in the dispersion medium, it is preferable to add a prescribed surfactant to the dispersion liquid in order to prevent coagulation of carbon nanotubes and to achieve uniform dispersion arrangement of carbon nanotubes in the second substrate. Examples of the surfactant include polyalcohol and fatty ester-based, or polyoxyethylene-based, polyoxyethylene-based surfactants, or nonionic surfactants including both. The polyoxyethylene-based nonionic surfactant is preferred.

Carbon nanotubes can be dispersed uniformly in the dispersion liquid, for example, by dispersing them in the dispersion liquid while performing sonication. Furthermore, the addition of the surfactant can prevent the carbon nanotubes from coagulating after being dispersed in the dispersion liquid and can keep the carbon nanotubes dispersed in the dispersion liquid.

Examples of the resin include: polyolefin-based resins such as low-density or high-density polyethylene, ethylene-propylene copolymer, ethylene-butene copolymer, ethylene-hexene copolymer, ethylene-octene copolymer, ethylene-norbornene copolymer, ethylene-dimethano-octahydronapthalene copolymer, polypropylene, ethylene-vinyl acetate copolymer, ethylene-methyl methacrylate copolymer, and ionomer resins; polyester-based resins such as polyethylene terephthalate, polybutylene terephthalate, and polyethylene naphthalate; nylon-6, nylon-6,6, metaxylenediamine-adipic acid polycondensate; amide-based resins such as polymethylmethacrylimide; acrylic-based resins such as polymethyl methacrylate; styrene-acrylonitrile-based resins such as polystyrene, styrene-acrylonitrile copolymer, styrene-acrylonitrile-butadiene copolymer, and polyacrylonitrile; hydrophobicized cellulose-based resins such as cellulose triacetate and cellulose diacetate; halogen-containing resins such as polyvinyl chloride, polyvinylidene chloride, polyvinylidene fluoride, and polytetrafluoroethylene; hydrogen-bonding resins such as polyvinyl alcohol, ethylene-vinyl alcohol copolymer, and cellulose derivative; and engineering plastic-based resins such as polycarbonate resins, polysulfone resins, polyether sulfone resins, polyether ether ketone resins, polyphenylene oxide resins, polymethylene oxide resins, polyarylate resins, and liquid crystalline resins.

The second substrate may be formed by dispersively arranging the thermally conductive wires in glass rather than dispersively arranging the thermally conductive wires in resin. The second substrate can be formed, for example, by, first, mixing glass raw powder and carbon nanotubes well to form a powder mixture, and heating and fusing the powder mixture in an inert gas atmosphere, and cooling the resultant product to the room temperature for solidifying. Examples of the glass raw material include silica, soda ash (sodium carbonate), lime, potassium carbonate, lead oxide, boric acid, aluminum hydroxide, zinc oxide, barium carbonate, lithium carbonate, magnesium oxide, titanium oxide, zirconium oxide, and the like.

(Organic EL Element)

Next, the organic EL elements are formed on the second substrate. The organic EL element is configured to include a pair of electrodes 12 and 13 and the prescribed layer (organic EL layer) 14 including one or more layers provided between the electrodes, as described above.

The organic EL element emits light toward the second substrate. Therefore, of a pair of electrodes 12 and 13, one electrode 13 that is provided closer to the second substrate 3 is formed of an electrode exhibiting light transmittance, and the other electrode 12 is preferably formed of a reflective electrode that reflects light toward one electrode 13.

The organic EL element is formed by stacking one electrode 13, the prescribed layer 14 including one or more layers, and the other electrode 12 on the second substrate, successively from the second substrate 3 side. One of a pair of electrodes 12 and 13 is provided as an anode and the other is provided as a cathode.

The organic EL element 11 at least includes a light-emitting layer as the prescribed layer including one or more layers. Examples of the prescribed layer 14 provided between a pair of electrodes 12 and 13 (the anode and the cathode) include a light-emitting layer, an electron injection layer, an electron transport layer, a hole block layer, a hole injection layer, a hole transport layer, an electron block layer, and the like.

A variety of structures can be contemplated as the structure of the organic EL element.

Figure 4:
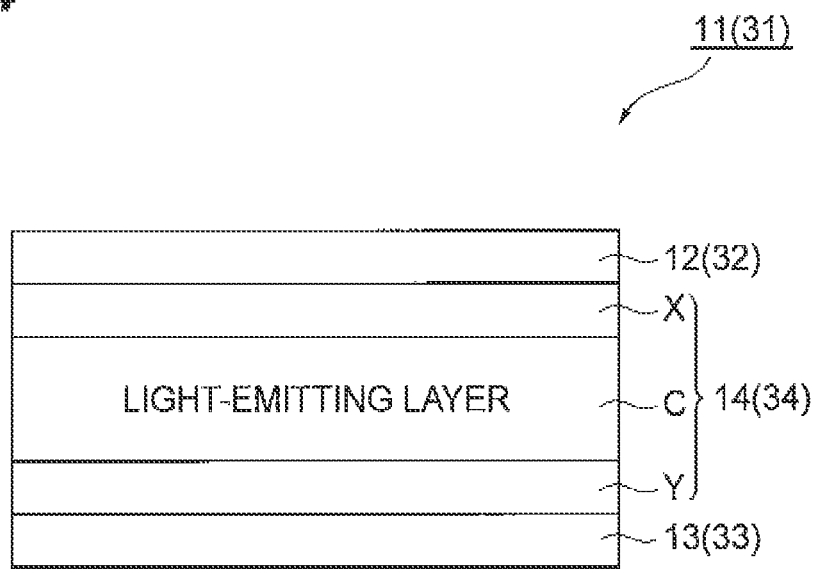
FIG. 4 is a longitudinal sectional view of an organic EL element.

In the structure illustrated in FIG. 4, the organic EL layer 14 is interposed between the electrode (anode) 13 and the electrode (cathode) 12. The organic EL layer 14 includes a light-emitting layer C, an organic layer X interposed between the light-emitting layer C and the electrode 12, and an organic layer Y interposed between the light-emitting layer C and the electrode 13.

Figure 5:
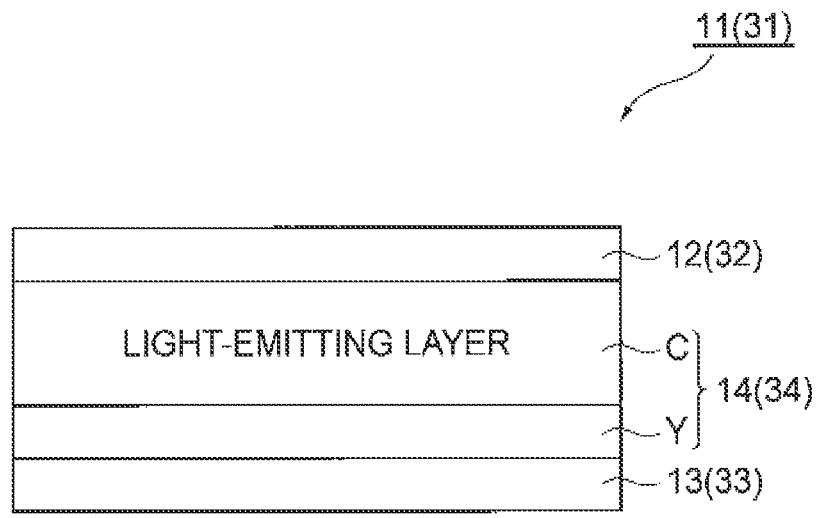
FIG. 5 is a longitudinal sectional view of an organic EL element.

In the structure illustrated in FIG. 5, although the organic EL layer 14 is interposed between the electrode 13 and the electrode 12, the organic EL layer 14 includes a light-emitting layer C and an organic layer Y interposed between the light-emitting layer C and the electrode 13, and the light-emitting layer C is in contact with the electrode 12.

Figure 6:
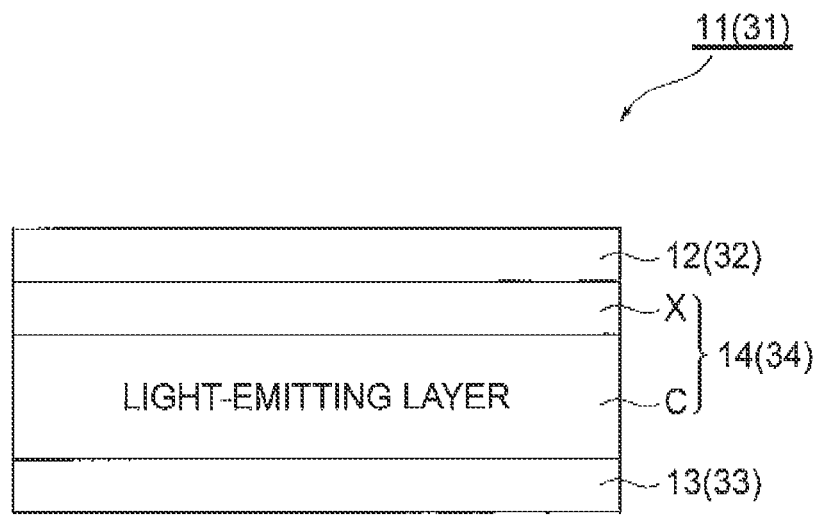
FIG. 6 is a longitudinal sectional view of an organic EL element.

In the structure illustrated in FIG. 6, although the organic EL layer 14 is interposed between the electrode 13 and the electrode 12, the organic EL layer 14 includes a light-emitting layer C and an organic layer X interposed between the light-emitting layer C and the electrode 12, and the light-emitting layer C is in contact with the electrode 13.

Figure 7:
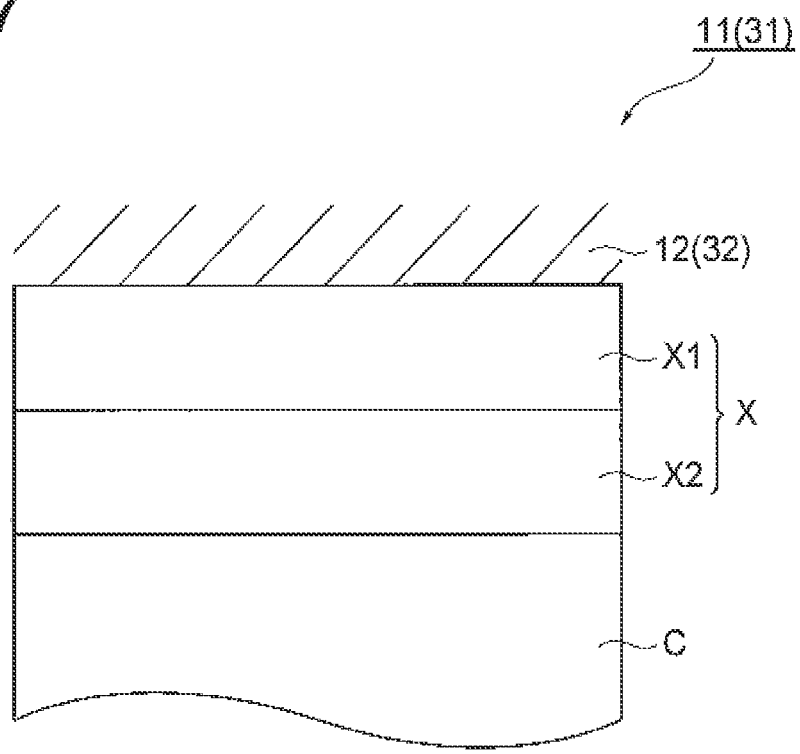
FIG. 7 is a partial longitudinal sectional view of an organic EL element.
Figure 8:
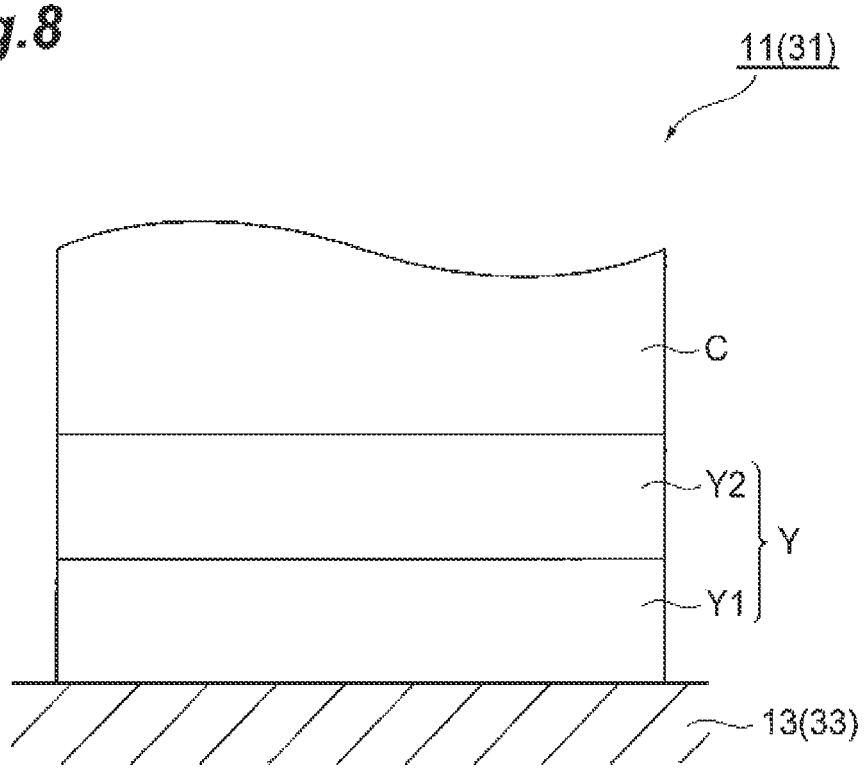
FIG. 8 is a partial longitudinal sectional view of an organic EL element.

As illustrated in FIG. 7, the organic layer X may be made of two or more kinds of organic layers X1 and X2. As illustrated in FIG. 8, the organic layer Y may be made of two or more kinds of organic layers Y1 and Y2.

Figure 11:
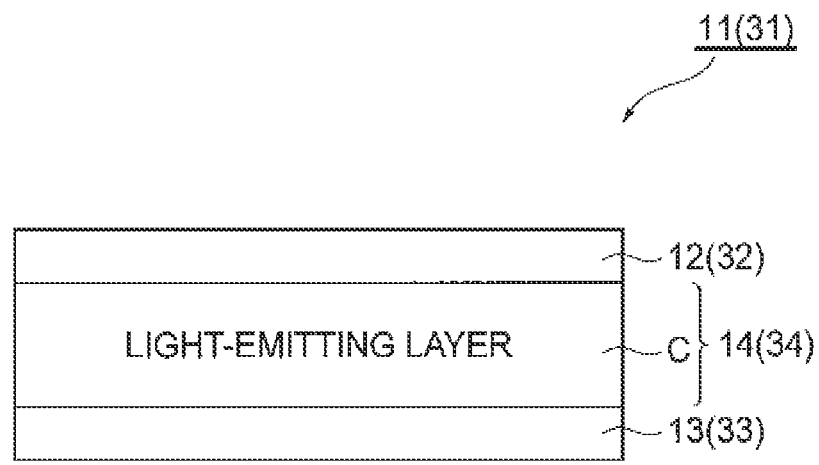
FIG. 11 is a longitudinal sectional view of an organic EL element.

As illustrated in FIG. 11, as the structure of the organic EL element, only the light-emitting layer C may be formed between the electrode 12 and the electrode 13.

Examples of the layered structure employed by the organic EL element are listed below:
a) anode 13/light-emitting layer C/cathode 12 (see FIG. 11);
b) anode 13/hole injection layer Y/light-emitting layer C/cathode 12 (see FIG. 5);
c) anode 13/hole injection layer Y/light-emitting layer C/electron injection layer X/cathode 12 (see FIG. 4);
d) anode 13/hole injection layer Y/light-emitting layer C/electron transport layer X/cathode 12 (see FIG. 4);
e) anode 13/hole injection layer Y/light-emitting layer C/electron transport layer X2/electron injection layer X1/cathode 12 (see FIG. 4 and FIG. 7);

f) anode 13/hole transport layer Y/light-emitting layer C/cathode 12 (see FIG. 5);

g) anode 13/hole transport layer Y/light-emitting layer C/electron injection layer X/cathode 12 (see FIG. 4);

h) anode 13/hole transport layer Y/light-emitting layer C/electron transport layer X/cathode 12 (see FIG. 4);

i) anode 13/hole transport layer Y/light-emitting layer C/electron transport layer X2/electron injection layer X1/cathode 12 (see FIG. 4 and FIG. 7);

j) anode 13/hole injection layer Y1/hole transport layer Y2/light-emitting layer C/cathode 12 (see FIG. 5 and FIG. 8);

k) anode 13/hole injection layer Y1/hole transport layer Y2/light-emitting layer C/electron injection layer X/cathode 12 (see FIG. 4 and FIG. 8);

l) anode 13/hole injection layer Y1/hole transport layer Y2/light-emitting layer C/electron transport layer X/cathode 12 (see FIG. 4 and FIG. 8);

m) anode 13/hole injection layer Y1/hole transport layer Y2/light-emitting layer C/electron transport layer X2/electron injection layer X1/cathode 12 (see FIG. 4, FIG. 7, and FIG. 8);

n) anode 13/light-emitting layer C/electron injection layer X/cathode 12 (see FIG. 6);

o) anode 13/light-emitting layer C/electron transport layer X/cathode 12 (see FIG. 6); and p) anode 13/light-emitting layer C/electron transport layer X2/electron injection layer X1/cathode 12 (see FIG. 6 and FIG. 7).

Figure 9:
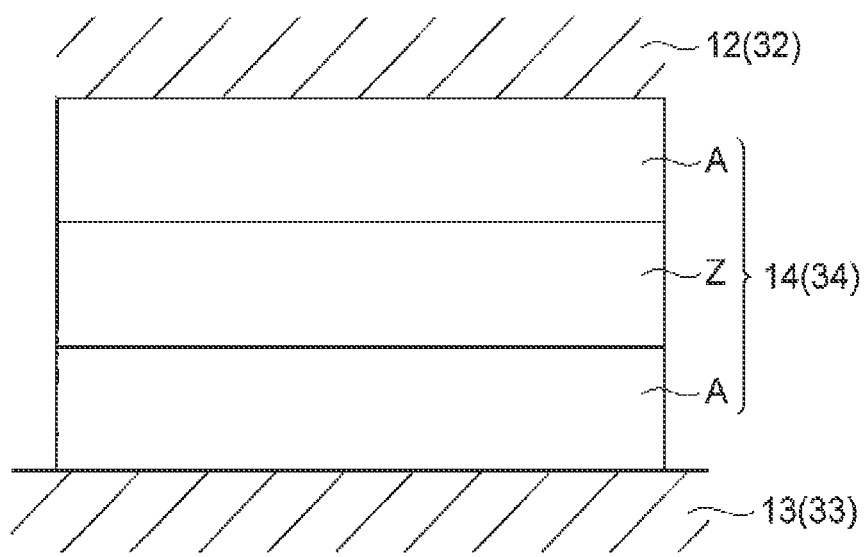
FIG. 9 is a longitudinal sectional view of an organic EL element.

The organic EL element in the present embodiment may include two or more light-emitting layers. Assuming that the stack sandwiched between the anode and the cathode in any one of the layered structures of a) to p) above is "structural unit A," the organic EL element having two light-emitting layers may be configured as a layered structure shown in q) below as illustrated in FIG. 9. It is noted that the two layered structures (structural unit A) may be the same or different from each other.

q) anode 13/(structural unit A)/charge generation layer Z/(structural unit A)/cathode 12

Figure 10:
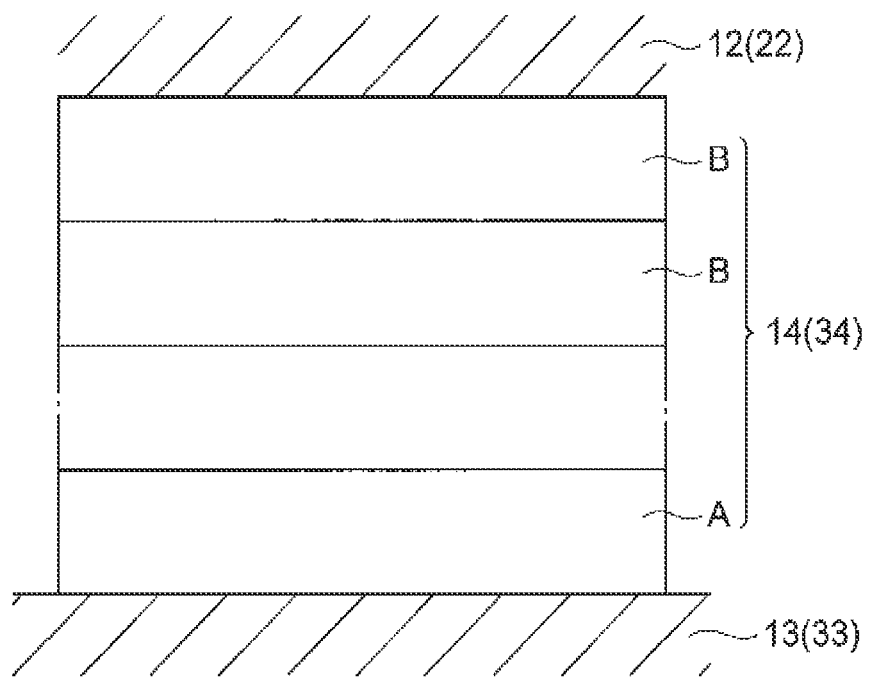
FIG. 10 is a longitudinal sectional view of an organic EL element.

Assuming that "(structural unit A)/charge generation layer Z" is the "structural unit B," the organic EL element having three or more light-emitting layers may be configured as a layered structure shown in r) below as illustrated in FIG. 10.

r) anode 13/(structural unit B)$_x$/(structural unit A)/cathode 12.

The symbol "x" represents an integer equal to or greater than two, and the (structural unit B)$_x$ represents a stack in which x "structural units B" are stacked. The layered structures of a plurality of (structural units B) may be the same or different from each other.

Here, the charge generation layer Z is a layer that generates holes and electrons by applying an electric field. Examples of the charge generation layer Z include thin films made of vanadium oxide, indium tin oxide (abbreviated as ITO), and molybdenum oxide.

In the organic EL element in such a manner that, of a pair of electrodes, one electrode 13 exhibiting light transmittance is an anode and the other electrode 12 is a cathode, the layers are stacked on the second substrate 3 in order from the layer on the left side in the configurations of a) to q) above. Conversely, in the organic EL element in such a manner that one electrode 13 exhibiting light transmittance is a cathode and the other electrode 12 is an anode, the layers are stacked on the second substrate 3 in order from the layer on the right side in the configurations of a) to q) above.

The organic EL element 11 shown in FIG. 1 and FIG. 14 has the organic EL layer 14 between the electrodes 12 and 13. The structure having the organic layers X (X1, X2) and Y (Y1, Y2) and the light-emitting layer C has been described above as the layered structure of the organic EL layer 14. By contrast, in the structure shown in FIG. 3 and FIG. 15, the description about the electrodes 12 and 13 and the organic EL layer 14 is replaced with that for the electrodes 32 and 33 and the organic EL layer 34 with the drawings in FIG. 4 to FIG. 11 turned upside down. Those layered structures function even when turned upside down, as a matter of course.

(Pair of Electrodes)

A pair of electrodes are formed, for example, of thin films of metal oxides, metal sulfides, metals, and the like, and an optimum material is selected as appropriate for each of the anode and the cathode. For example, in the case where one electrode exhibiting light transmittance is used as an anode, a thin film made of indium oxide, zinc oxide, tin oxide, ITO, Indium Zinc Oxide (abbreviated as IZO), gold, platinum, silver, copper, and the like may be used as an electrode. In the case where one electrode exhibiting light transmittance is used as the cathode, the electrode is preferably formed using a material in which the work function is small, the electron injection into the light-emitting layer is easy, and the electric conductivity is high. For example, a thin film made of alkali metals, alkaline earth metals, transition metals, and metals in Group 13 may be used as the electrode, The other electrode 12 having a polarity different from one electrode may be formed using the materials illustrated as one electrode exhibiting light transmittance. In this case, a reflective electrode may be formed by increasing the film thickness. For example, a reflective electrode may be formed by stacking a light-reflecting thin film with high electrical conductivity, such as Al, Au and Ag, and an electrode exhibiting light transmittance.

A pair of electrodes each can be provided by patterning the material above into a prescribed shape by vacuum evaporation, sputtering, and coating methods. Examples of patterning a pair of electrodes include a method of forming a pattern by selectively forming a thin film of the material described above at a prescribed position, and a method of forming a thin film of the material above over the entire surface and thereafter patterning the thin film into a prescribed shape by photolithography.

(Prescribed Layer)

The prescribed layer can be formed by successively forming films of prescribed materials described below. Examples of the film formation method include vacuum evaporation and coating methods. A film formation method suitable for a prescribed material below may be used. FIG. 1 and FIG. 3 show an organic EL element configured such that the prescribed layer is formed continuously across a plurality of organic EL elements. However, the prescribed layer may be formed individually and independently for each of the organic EL elements.

Examples of the hole injection material that forms the hole injection layer include oxides such as vanadium oxide, molybdenum oxide, ruthenium oxide, and aluminum oxide, phenylamine-based compounds, starburst type amine-based compounds, phthalocyanine-based compounds, amorphous carbon, polyaniline, and polythiophene derivatives.

Examples of the hole transport material that forms the hole transport layer include polyvinylcarbazole or derivatives thereof, polysilane or derivatives thereof, polysiloxane derivatives having an aromatic amine in their side chain or main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly(p-phenylene vinylene) or derivatives thereof, or poly(2,5-thienylene vinylene) or derivatives thereof.

The light-emitting layer is generally formed of an organic material that mainly emits fluorescence and/or phosphorescence or of the organic material and an assist dopant therefor. The dopant is added for the purpose of improving the light-emission efficiency and changing the wavelength of emitted light. The organic material may be either a low molecular compound or a high molecular compound. In a case where the light-emitting layer is formed by the coating method, the light-emitting layer preferably includes a high molecular compound because a high molecular compound generally has a high solubility and is thus suitable for the coating method. In this description, the high molecular compound means a compound having a number-average molecular weight of $10^3$ to $10^8$ in terms of polystyrene. Examples of the light-emitting material that forms the light-emitting layer include the following dye-based materials, metal complex-based materials, polymer-based materials, and dopant materials.

Examples of the dye-based material may include cyclopendamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimer, pyrazoline dimer, quinacridone derivatives, and coumarin derivatives.

Examples of the metal complex-based material may include metal complexes having central metals such as rare earth metals such as Tb, Eu and Dy or Al, Zn, Be Ir, and Pt, and ligands such as oxadiazole, thiadiazole, phenylpyridine, phenylbenzimidazole, and a quinoline structure. Specific examples of the metal complex-based material may include metal complexes, such as iridium complexes and platinum complexes, that emit light from a triplet excited state, an aluminum quinolinol complex a benzoquinolinol beryllium complex, a benzoxazolyl zinc complex, a benzothiazole zinc complex, an azomethyl zinc complex, a porphyrin zinc complex, and a phenanthroline europium complex.

(Polymer-Based Material)

Examples of the polymer-based material may include polyparaphenylene vinylene derivatives, polythiophene derivatives, polyparaphenylene derivatives, polysilane derivatives, polyacetylene derivatives, polyfluorene derivatives, polyvinylcarbazole derivatives, and polymerized products of the above dye-based materials or metal complex-based light-emitting materials.

(Dopant Material)

Examples of the dopant material may include perylene derivatives, coumarin derivatives, rubrene derivatives, quinacridone derivatives, squalium derivatives, porphyrin derivatives, styryl-based dyes, tetracene derivatives, pyrazolone derivatives, decacyclene, and phenoxazone.

Examples of the electron transport material that forms the electron transport layer may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or 8-hydroxyquinoline or metal complexes of derivatives thereof, polyquinoline or derivatives thereof, polyquinoxaline or derivatives thereof, and polyfluorene or derivatives thereof.

Examples of the material that forms the electron injection layer may include alkali metals, alkaline earth metals, alloys containing at least one of alkali metals and alkaline earth metals, oxides, halides, and carbonates of alkali metals or alkaline earth metals, or mixtures of these materials.

(First Substrate)

After forming the organic EL elements, the first substrate 2 is affixed to the second substrate 3. A gas-tight substrate is used as the first substrate 2. Preferably, the first substrate 2 has heat conduction performance. For example, a substrate similar to the second substrate 3 described above can be used as the first substrate 2. An opaque substrate can be used as the first substrate 2, and therefore, even when the thermally conductive wires are dispersively arranged in the first substrate 2 in a similar manner as the second substrate, the diameter of the thermally conductive wire arranged may not be 0.4 μm or less.

The first substrate 2 has a heat radiation layer exhibiting heat radiation. The heat radiation layer of the first substrate 2 may be formed in various manners including a single-layer structure and a multilayer structure. Preferably, the heat radiation layer has heat conduction performance in addition to heat radiation performance.

The heat radiation layer of the single-layer structure can be formed, for example, by mixing a material exhibiting high heat radiation, such as a black pigment, with a resin material, applying the mixed material to form a film, and solidifying the film. The heat radiation layer of the single-layer structure having high heat conduction performance in addition to high heat radiation performance can be formed, for example, by mixing fine particles exhibiting high heat conduction, in addition to the material exhibiting high heat radiation, with a resin material, applying the mixed material to form a film, and solidifying the film.

The heat radiation layer having a stack of a plurality of layers is configured with, for example, a stack of a layer exhibiting high heat conduction and a layer exhibiting high heat radiation. For example, a heat radiation layer formed of a stack in which a layer exhibiting high heat radiation is formed on one surface or both surfaces of a high thermal conductive layer can be formed by forming a high thermal conductive layer made of a material exhibiting high heat conduction, and coating one surface or both surfaces of the high thermal conductive layer with a paint including a black pigment exhibiting high heat radiation. Specific examples of such a heat radiation layer include an aluminum sheet painted black (manufactured by KOBE STEEL, LTD, under the product name of KOBEHONETSU Aluminum (KS750), thermal conductivity: 230 W/m·K, thermal emissivity: 0.86).

The heat radiation layer may be formed directly on the first substrate, or the heat radiation layer is preliminarily formed on a prescribed base material and then affixed to the first substrate using a prescribed bonding material.

Specifically, for example, a stack of a layer exhibiting high heat conduction and a layer exhibiting high heat radiation is fabricated by coating one main surface of an aluminum sheet exhibiting high heat conduction with a black paint exhibiting high heat radiation, and a heat radiation layer formed of this stack is then affixed to the first substrate using a prescribed bonding material. Alternatively, for example, a heat radiation layer may be formed directly on the first substrate 2 by evaporating aluminum on the first substrate 2 to form a layer exhibiting high heat conduction, and then coating the surface of this aluminum layer with a black paint to form a layer exhibiting high heat radiation.

A bonding material with high heat conduction, such as acrylic adhesives or epoxy adhesive, is suitably used. The heat radiation layer may be affixed to the first substrate by fusion without using a bonding material.

The first substrate 2 is affixed to the second substrate 3 by the prescribed adhesive member 5. Acrylic adhesives, epoxy adhesives, and the like may be used as the adhesive member 5.

Preferably, the gap between the first substrate 2 and a plurality of organic EL elements 11 is filled with the thermally conductive member 6. The thermally conductive member 6 is formed, for example, of the resin described above as the material of the second substrate and the thermally conductive wires dispersively arranged in the resin. Examples of the film formation method therefor may include a formation method similar to the method of forming the second substrate made of resin and thermally conductive wires dispersively arranged in the resin. Preferably, a resin having high thermal conductivity is used as the resin that forms the thermally conductive member 6.

A method of producing the light emitting device 21 in the embodiment illustrated in FIG. 3 will now be described. As described above, the sealing substrate is described as the first substrate 2 and the support substrate is described as the second substrate 3 in the light emitting device in the foregoing embodiment illustrated in FIG. 1, whereas the numerals denoting the substrates are changed in the light emitting device 21 in the present embodiment illustrated in FIG. 3, wherein the support substrate is described as the first substrate 22 and the sealing substrate is described as the second substrate 23. A substrate exhibiting light transmittance is used as the support substrate (second substrate) in the embodiment illustrated in FIG. 1, whereas a substrate exhibiting light transmittance is used as the sealing substrate (second substrate) in the present embodiment illustrated in FIG. 3.

In the method of producing the light emitting device 21, after the organic EL elements 31 are formed on the support substrate 22, an adhesive member 25 is arranged on the periphery of the support substrate 22, and the thermally conductive member 26 is arranged on the organic EL elements 31. Then, the support substrate 22 and the sealing substrate 23 are affixed together with the adhesive member 25 interposed therebetween. The gap between the substrates 22 and 23 may be filled with the thermally conductive member 26 by injecting a resin material that forms the thermally conductive member into the gap after affixing the substrates 22 and 23 together. The method of producing the light emitting device 1 is the same as the method of producing the light emitting device 21, wherein the order in which the layers of the light emitting devices 11 and 31 are formed is determined depending on the vertical relation of theses layers, and the layers are formed to be stacked on the support substrate in order of increasing distance from the support substrate.

(First Substrate)

The same member as the first substrate 2 in the foregoing embodiment illustrated in FIG. 1 can be used as the first substrate 22 in the embodiment illustrated in FIG. 3. The first substrate 22 has the heat radiation layer 24 in a similar manner as the foregoing embodiment.

(Organic EL Element)

The organic EL element in the present embodiment emits light toward the second substrate 23. Therefore, of a pair of electrodes, one electrode 33 arranged closer to the second substrate is formed of an electrode exhibiting light transmittance, and the other electrode 32 arranged closer to the first substrate 22 is preferably formed of a reflective electrode that reflects light toward one electrode 33 in a similar manner as the foregoing embodiment.

In a similar manner as the foregoing embodiment, the organic EL element is formed by stacking the other electrode 32, the prescribed layer including one or more layers, and one electrode 33 on the first substrate 22 in this order from the first substrate 22 side.

(Second Substrate)

The same member as the second substrate 3 in the foregoing embodiment illustrated in FIG. 1 can be used as the second substrate 23 in the embodiment illustrated in FIG. 3. The second substrate 23 is affixed to the first substrate 22 by the adhesive member 25. Similar adhesives as in the foregoing embodiment can be used for the adhesive member 25.

In a similar manner as the embodiment illustrated in FIG. 1, preferably, the thermally conductive member 26 is provided in the gap between the second substrate 23 provided as the sealing substrate and a plurality of organic EL elements 31. In the embodiment illustrated in FIG. 1, a thermally conductive member exhibiting no light transmittance may be provided in the gap because light radiated from the organic EL elements 11 does not pass through the thermally conductive member 6. However, in the present embodiment illustrated in FIG. 3, the thermally conductive member 26 exhibiting light transmittance has to be provided in the gap because light is emitted to the outside through the thermally conductive member 26.

In the present embodiment, the thermally conductive member 26 exhibiting light transmittance is formed, for example, of resin exhibiting light transmittance and the thermally conductive wires as described above having a diameter of 0.4 μm or less which are dispersively arranged in the resin.

The light emitting device described above can be used, for example, as an illumination apparatus or a light source of a scanner.

Reference Signs List
  1 light emitting device
  2 first substrate
  3 second substrate
  4 heat radiation layer
  5 adhesive member
  6 thermally conductive member
  11 organic EL element
  12 the other electrode
  13 one electrode
  14 prescribed layer including one or more layers
  15 light traveling direction
  21 light emitting device
  22 first substrate
  23 second substrate
  24 heat radiation layer
  25 adhesive member
  26 thermally conductive member
  31 organic EL element
  32 one electrode
  33 the other electrode
  34 prescribed layer including one or more layers
  35 light traveling direction

The invention claimed is:
1. A light emitting device comprising:
a first substrate including a heat radiation layer;
a second substrate exhibiting light transmittance; and
a plurality of organic EL elements provided between the first substrate and the second substrate to emit light toward the second substrate, wherein the second substrate includes fibrous, thermally conductive wires dispersively arranged therein, and the thermally conductive wires have a diameter of 0.4 μm or less and have a thermal conductivity higher than a remaining component of the second substrate excluding the thermally conductive wires.

2. The light emitting device according to claim 1, wherein the first substrate includes a heat dissipation member having heat radiation performance.

3. The light emitting device according to claim 1, wherein
the heat radiation layer is arranged approximately vertically to a thickness direction of the first substrate, and
the plurality of organic EL elements each are arranged at a position overlaid on the heat radiation layer as viewed from one thickness direction of the first substrate.

4. The light emitting device according to claim 1, wherein
a gap is provided between the first or second substrate and the plurality of organic EL elements, and
the gap is filled with a thermally conductive member including resin exhibiting light transmittance and the fibrous, thermally conductive wires dispersively arranged in the resin.

5. The light emitting device according to claim 1, wherein each of the thermally conductive wires is at least one of a metal nanowire and a carbon nanotube.

6. The light emitting device according to claim 1, wherein the plurality of organic EL elements form a series connection and/or a parallel connection.

7. The light emitting device according to claim 1, wherein the diameter of the thermally conductive wires is 0.001 μm or more.

\* \* \* \* \*